(12) United States Patent
Yun et al.

(10) Patent No.: US 8,164,952 B2
(45) Date of Patent: Apr. 24, 2012

(54) NONVOLATILE MEMORY DEVICE AND RELATED METHOD OF PROGRAMMING

(75) Inventors: Sung-Won Yun, Suwon-si (KR); Kihwan Choi, Seongnam-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 284 days.

(21) Appl. No.: 12/719,184

(22) Filed: Mar. 8, 2010

(65) Prior Publication Data

US 2010/0246258 A1  Sep. 30, 2010

(30) Foreign Application Priority Data

Mar. 25, 2009 (KR) .................. 10-2009-0025506

(51) Int. Cl.
*G11C 16/04* (2006.01)
(52) U.S. Cl. ......... 365/185.03; 365/185.18; 365/185.19; 365/185.22
(58) Field of Classification Search ............. 365/185.03, 365/185.18–185.19, 185.22, 185.28, 189.09
See application file for complete search history.

(56) References Cited

U.S. PATENT DOCUMENTS

| 6,243,290 | B1 | 6/2001 | Kurata et al. |
| 7,317,636 | B2 | 1/2008 | Ide et al. |
| 7,573,750 | B2 * | 8/2009 | Shibata .................... 365/185.22 |

FOREIGN PATENT DOCUMENTS

| JP | 2001067884 A | 3/2001 |
| JP | 2005353242 A | 12/2005 |
| JP | 2006190488 A | 7/2006 |
| KR | 1020010082518 A | 8/2001 |
| KR | 1020060046437 A | 5/2006 |

* cited by examiner

*Primary Examiner* — David Lam
(74) *Attorney, Agent, or Firm* — Volentine & Whitt, PLLC

(57) ABSTRACT

A nonvolatile memory device comprises a memory cell array comprising a plurality of memory cells, a voltage generator configured to generate voltages to program the plurality of memory cells, and a control logic component configured to control the voltage generator to provide a plurality of program voltages to selected memory cells during successive iterations of a program loop. Wherein where memory cells corresponding to one logic state are judged to be program passed during a current iteration of the program loop, the control logic component controls the voltage generator such that a program voltage corresponding to the one logic state is skipped during subsequent iterations of the program loop.

20 Claims, 11 Drawing Sheets

NONVOLATILE MEMORY DEVICE AND RELATED METHOD OF PROGRAMMING

STATEMENT OF RELATED APPLICATION

This application claims priority under 35 U.S.C §119 to Korean Patent Application No. 10-2009-0025506 filed Mar. 25, 2009, the disclosure of which is hereby incorporated by reference in its entirety.

BACKGROUND

Embodiments of the inventive concept relate generally to nonvolatile memory devices. More particularly, embodiments of the inventive concept relate to nonvolatile memory devices and related methods of programming.

Semiconductor memory devices can be roughly divided into two categories based on whether they retain stored data when disconnected from power. These categories include volatile memory devices, which lose stored data when disconnected from power, and nonvolatile memory devices, which retain stored data when disconnected from power.

Examples of volatile memory devices include dynamic random access memory (DRAM), static random access memory (SRAM), and examples of nonvolatile memory devices include electrically erasable programmable read only memory (EEPROM), ferroelectric random access memory (FRAM), phase-change random access memory (PRAM), magnetoresistive random access memory (MRAM), and flash memory.

In recent years, there has been an increase in the number of devices employing nonvolatile memory devices. As examples, nonvolatile memory devices are being used increasingly in MP3 players, digital cameras, cellular phones, camcorders, flash cards, solid state drives (SSDs), to name but a few. In addition, there has also been an increase in the overall storage capacity of nonvolatile memory devices, resulting in a tremendous amount of nonvolatile data storage in use today.

The storage capacity of a nonvolatile memory device may be further increased by storing more than one bit of data in each memory cell. Nonvolatile memory devices storing more than one bit of data in each memory cell are called multi-level cell (MLC) devices because the memory cells store multiple levels of data, e.g., lower level bits, upper level bits, mid-level bits, and so on. Unfortunately, conventional techniques for programming MLC devices may suffer from errors caused by electrical interference between adjacent memory cells.

SUMMARY

Embodiments of the inventive concept provide nonvolatile memory devices and related programming methods. Some of these embodiments allow programming operations to be performed with decreased power consumption and electrical interference compared with conventional nonvolatile memory devices and programming methods.

According to one embodiment of the inventive concept, a nonvolatile memory device comprises a memory cell array comprising a plurality of memory cells, a voltage generator configured to generate voltages to program the plurality of memory cells to a plurality of logic states, and a control logic component configured to control the voltage generator to provide a plurality of program voltages to selected memory cells during multiple program loop iterations. Where all of the selected memory cells corresponding to one of the plurality of logic states are judged to be program passed during a current program loop iteration, the control logic component controls the voltage generator such that a program voltage corresponding to the one of the plurality of logic states is skipped during a next program loop iteration.

In certain embodiments, the plurality of program voltages correspond to different respective logic states. Moreover, in some embodiments, the control logic component is further configured to control the voltage generator to generate a plurality of verification voltages within each program loop iteration. In some embodiments, the control logic component is configured to control the voltage generator to generate one of the plurality of verification voltages following each of the plurality of program voltages.

In certain embodiments, each of the plurality of program voltages corresponds to one or more logic states. In certain embodiments, the nonvolatile memory device further comprises a storage region configured to store information indicating whether memory cells corresponding to the logic state are judged to be program passed. In certain embodiments, each of the plurality of memory cells stores two or more bits of data. In certain embodiments, the plurality of program voltages increase monotonically within each program loop iteration.

According to another embodiment of the inventive concept, a method of programming multi-bit data in a nonvolatile memory device comprises performing multiple program loop iterations in which a plurality of program voltages and a plurality of verification voltages are applied to a selected wordline to program selected memory cells into target states. Where all of the selected memory cells to be programmed at least one of the target states are successfully programmed in a current program loop iteration, generation of the program and verification voltages corresponding to the at least one target state is skipped in subsequent program loop iterations.

In certain embodiments, the plurality of program voltages and the plurality of verification voltages are applied sequentially to the selected wordline. In certain embodiments, each of the plurality of program voltages are used to program memory cells into one of the target states. In certain embodiments, at least one of the plurality of program voltages is used to program memory cells into at least two of the target states.

In certain embodiments, when the at least one program voltage is applied to the selected wordline, a bitline corresponding to one of the at least two target states is biased with a voltage lower than a program-inhibition voltage and higher than a ground voltage, and a bitline corresponding to the other of the at least two target states is biased to ground.

In certain embodiments, the method further comprises storing information, indicating that the at least one target state is program passed, in a register of the nonvolatile memory device. In certain embodiments, the information in the register is provided to the external of the nonvolatile memory device. In certain embodiments, the information in the register is used to control a generation of the plurality of program voltages and the plurality of verification voltages in the subsequent program loop iterations.

According to still another embodiment of the inventive concept, a method of programming multi-bit data in a nonvolatile memory device comprises supplying selected memory cells with a plurality of program voltages to program the selected memory cells into target states, supplying the selected memory cells with a plurality of program voltages to verify whether the selected memory cells are programmed into the target states, judging whether the each of the selected memory cells is successfully programmed to a corresponding one of the target states, storing results of the judging in a register, and iterating a program loop until all of the selected memory cells are successfully programmed to the corresponding target states. Where all of the selected memory cells corresponding one of the target states are successfully programmed in one iteration of the program loop, generation of program and verification voltages corresponding to the one target state is skipped during subsequent iterations of the program loop.

In certain embodiments, at least one of the plurality of program voltages is used to program memory cells into at least two of the target states. In certain embodiments, where the at least one program voltage is applied to the selected memory cells, a bitline corresponding to one of the at least two target states is biased with a voltage lower than a program-inhibition voltage and higher than a ground voltage, and a bitline corresponding to the other of the at least two target states is biased with a ground voltage. In some embodiments, the method further comprises increasing each of the plurality of program voltages during each successive iteration of the program loop.

BRIEF DESCRIPTION OF THE DRAWINGS

Embodiments of the inventive concept will be more clearly understood from the following detailed description taken in conjunction with the accompanying drawings. In the drawings, like reference numerals denote like features.

DETAILED DESCRIPTION OF THE EMBODIMENTS

Figure 1:
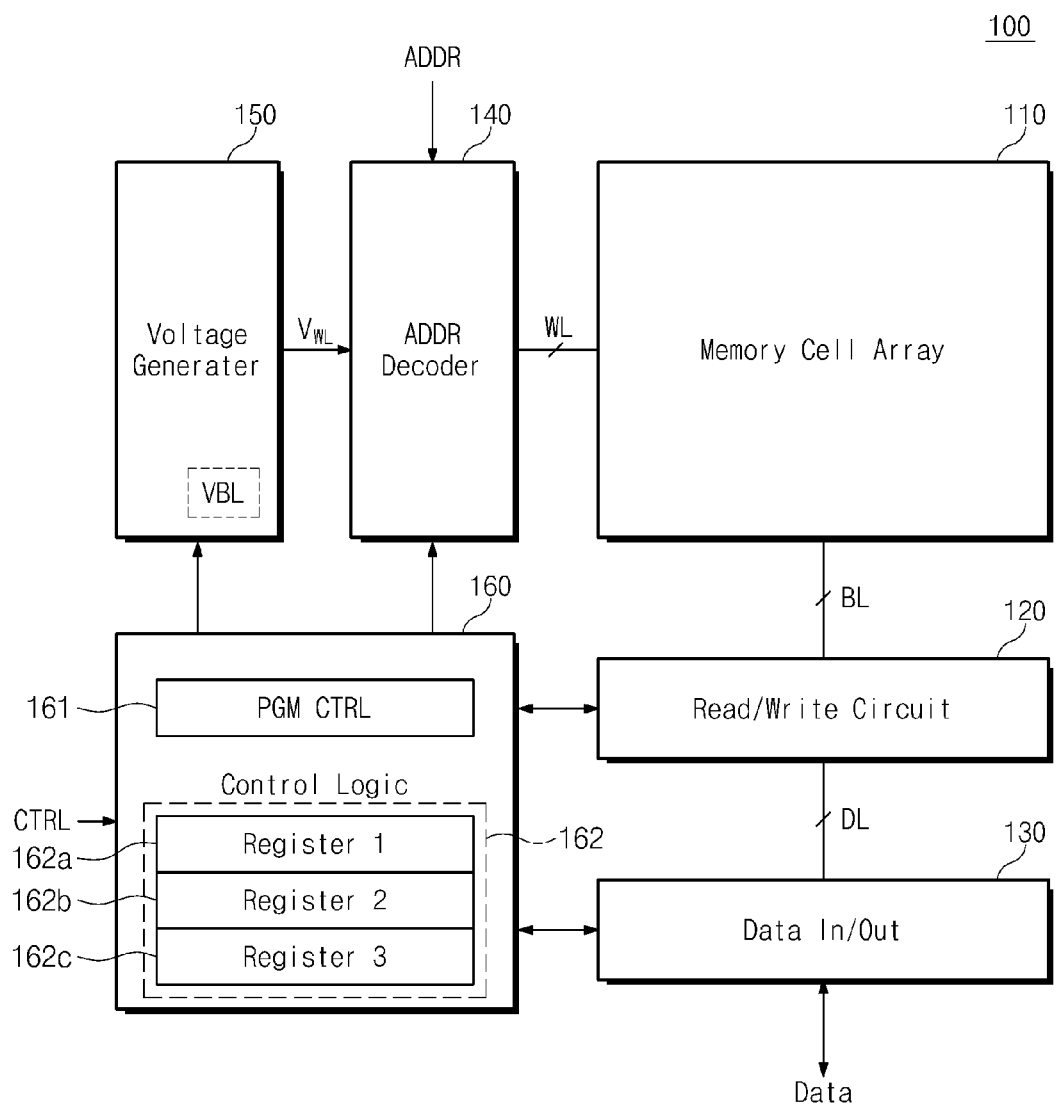
FIG. 1 is a block diagram illustrating a nonvolatile memory device according to an embodiment of the inventive concept.

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

It will be understood that, although the terms first, second, third, etc., may be used herein to describe various elements, components, regions, and/or sections, these elements, components, regions, and/or sections should not be limited by these terms. These terms are only used to distinguish one element, component, region, or section from another region or section. Thus, a first element, component, region, or section discussed below could be termed a second element, component, region, or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" can encompass both an orientation of above and below. The device may be otherwise oriented (rotated 90 degrees or at other orientations) and the spatially relative descriptors used herein will be interpreted accordingly. In addition, it will also be understood that when an element is referred to as being "between" two other elements, it may be the only element between the two other elements, or one or more intervening elements may also be present.

The terminology used herein is for the purpose of describing particular embodiments only and is not intended to limit the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element is referred to as being "on", "connected to", "coupled to", or "adjacent to" another element, it can be directly on, connected, coupled, or adjacent to the other element, or intervening elements may be present. In contrast, when an element is referred to as being "directly on," "directly connected to", "directly coupled to", or "immediately adjacent to" another element, there are no intervening elements present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Hereinafter, embodiments of the inventive concept will be explained in some additional detail with reference to the accompanying drawings.

FIG. 1 is a block diagram illustrating a nonvolatile memory device 100 according to an embodiment of the inventive concept. Referring to FIG. 1, nonvolatile memory device 100 comprises a memory cell array 110, a read/write circuit 120, a data input/output circuit 130, an address decoder 140, a voltage generator 150, and a control logic component 160.

Memory cell array 110 is connected to address decoder 140 via wordlines WL and connected to read/write circuit 120 via bitlines BL. Memory cell array 110 comprises a plurality of memory cells arranged in rows and columns, where each row of memory cells corresponds to one of wordlines WL, and each column of memory cells corresponds to one of bitlines BL. Each of the memory cells typically stores one or more bits per cell. Memory cell array 110 will be more fully described with reference to FIG. 2.

Read/write circuit 120 is connected to memory cell array 110 via bitlines BL and connected to data input/output circuit 130 via data lines DL. Read/write circuit 120 is supplied with a bitline voltage $V_{BL}$ generated by voltage generator 150. Read/write circuit 120 generally operates under the control of control logic component 160 and is configured to select bitlines BL in response to a decoded column address transferred from address decoder 140.

Read/write circuit 120 is configured to store data transferred from data input/output circuit 130 to memory cell array 110. Read/write circuit 120 is further configured to read data from memory cell array 110 and transfer the read data to data input/output circuit 130. Read/write circuit 120 is further configured to read data from a first storage region of memory cell array 110 and to store the read data in a second storage region of memory cell array 110. Such an operation may be referred to as a copy-back operation.

Read/write circuit 120 typically comprises elements such as a page buffer, a column selection circuit, and the like. Read/write circuit 120 may also comprise elements such as a sense amplifier, a write driver, a column selection circuit, and the like.

Data input/output circuit 130 is connected to read/write circuit 120 via data lines DL. Data input/output circuit 130 operates under the control of control logic component 160 and is typically configured to exchange data with an external device, such as a memory controller or a host. Data from the external device is typically received by read/write circuit 120 via data lines DL. Data from read/write circuit 120 may be sent to the external device through data input/output circuit 130. In some embodiments, data input/output circuit 130 comprises elements such as a data buffer.

Address decoder 140 is connected to memory cell array 110 via wordlines WL. Address decoder 140 is supplied with wordline voltages $V_{WL}$ from voltage generator 150. Address decoder 140 typically operates under the control of control logic component 160 and receives an address ADDR from the external device.

Address decoder 140 decodes a row address of a received address ADDR to select wordlines WL. Address decoder 140 decodes a column address of a received address ADDR and sends the decoded column address to read/write circuit 120.

In some embodiments, address decoder 140 comprises constituent elements such as a row decoder, a column decoder, an address buffer, and the like.

Voltage generator 150 supplies wordline voltages $V_{WL}$ to address decoder 140 to be applied to memory cell array 110 via wordlines WL. In the alternative, voltage generator 150 may generate bitline voltage $V_{BL}$ to read/write circuit 120, which bitline voltage $V_{BL}$ would then be applied to memory cell array 110 via bitlines BL.

In some embodiments, voltage generator 150 generates a plurality of program voltages and a plurality of verification voltages in every program loop. This will be more fully described with reference to FIGS. 3 through 7. In some embodiments, control logic component 160 is configured to incorporate voltage generator 150.

Control logic component 160 is connected with read/write circuit 120, data input/output circuit 130, address decoder 140, and voltage generator 150. Control logic component 160 is configured to control the overall operation of nonvolatile memory device 100. Control logic component 160 operates responsive to control signals CTRL transferred from the external device.

Control logic component 160 comprises a program control part 161, which is configured to control a program operation of memory cell array 110. Program control part 161 is typically configured to control voltage generator 150, which will be more fully described with reference to FIGS. 3 through 7.

Control logic component 160 further comprises a storage region 162, which stores information indicating whether memory cells in memory cell array 110 are programmed. Storage region 162 typically comprise a plurality of registers, such as three registers 162a, 162b, and 162c illustrated in FIG. 6. Storage region 162 will be more fully described with reference to FIGS. 3 through 7.

In FIG. 1, program control part 161 and storage region 162 are elements of control logic component 160. But these elements are not limited to being constituent elements of control logic component 160. In some embodiments, program control part 161 and storage region 162 comprise separate function blocks independent from control logic component 160.

In some embodiments, program control part 161 and storage region 162 comprise a digital circuit, an analog circuit, or a combination of digital and analog circuits. Alternatively, program control part 161 and storage region 162 may comprise software operated by nonvolatile memory device 100. In still other alternatives, program control part 161 and storage region 162 may comprise a combination of software and hardware.

Figure 2:
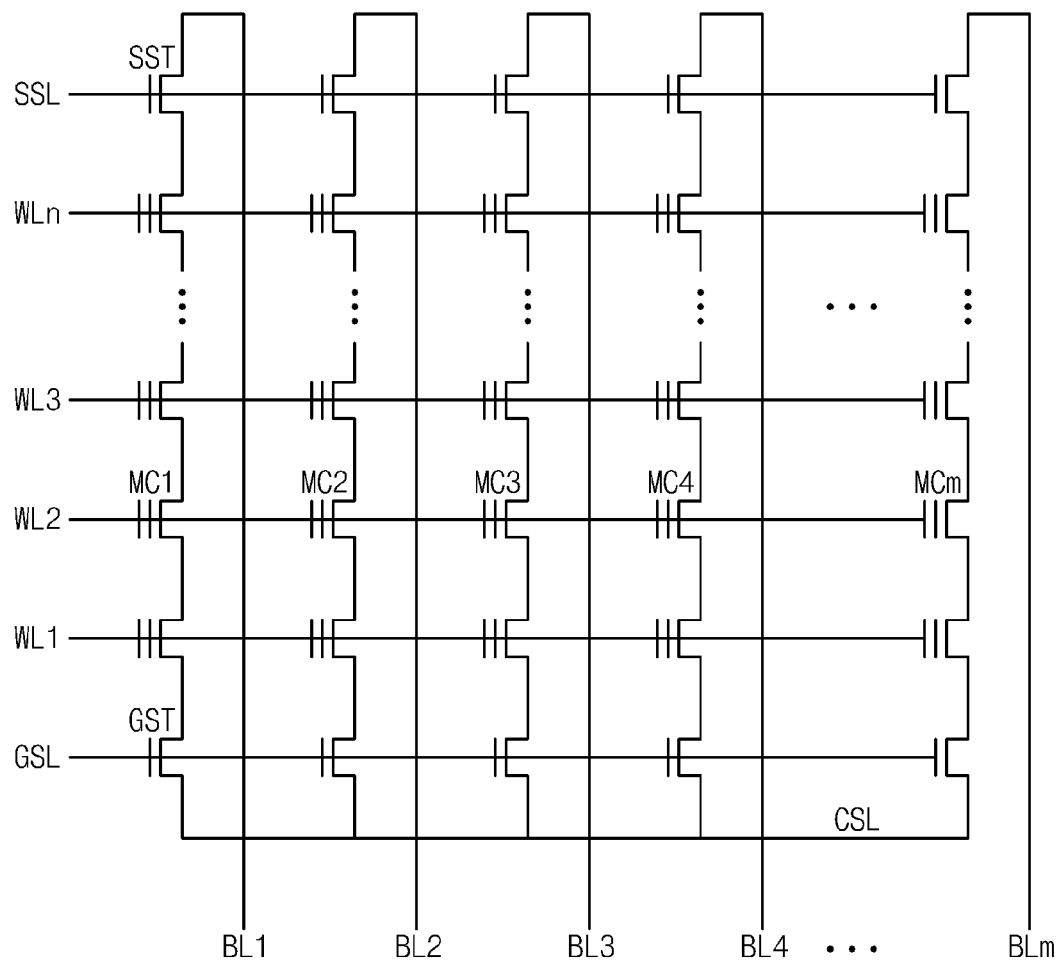
FIG. 2 is a circuit diagram illustrating a memory cell array in FIG. 1.

FIG. 2 is a circuit diagram illustrating memory cell array 110 of FIG. 1. Memory cell array 110 comprises a plurality of memory blocks. For ease of description, one memory block having a NAND string structure is illustrated in FIG. 2. But the inventive concept is not limited to a NAND configuration and could be implemented using flash memories with other configurations.

Referring to FIG. 2, memory cell array 110 comprises a plurality of strings, each having a plurality of memory cells connected in a series. A string select transistor SST connects a corresponding string of memory cells with a corresponding bitline, and a ground select transistor GST connects the corresponding string with a common source line CSL.

Rows of memory cells are connected with corresponding wordlines WL1 through WLm. For example, memory cells MC1 through MCm are connected with wordline WL2. String select transistors SST are connected with a string select line SSL, and ground select transistors GST are connected with a ground select line GSL. Wordlines WL1 through WLm, ground select line GSL, and string select line SSL are connected to address decoder 140 of FIG. 1. Bitlines BL1 through BLm are connected with string select transistors SST in respective columns and with read/write circuit 120 of FIG. 1.

For explanation purposes, it is assumed that each of memory cells MC1 through MCm stores two bits of data. Lower data bits (e.g., LSB data) stored in memory cells MC1 through MCm may constitute a lower page, and upper data bits (e.g., MSB data) stored in memory cells MC1 through MCm may constitute an upper page. More generally speaking, the lower bits of memory cells connected to the same wordline constitute a lower page of data, and the upper bits of memory cells connected to the same wordline constitute an upper page of data. In the description that follows, an operation for programming lower data bits is referred to as an LSB program operation, and an operation of programming upper data bits is referred to as an MSB program operation.

In an LSB program operation, a high voltage is applied to a selected wordline so that threshold voltages of cells connected with the selected wordline are shifted up to a target voltage. A threshold voltage distribution of cells programmed by the LSB program operation may be wider than a target threshold voltage distribution obtained after MSB programming is complete.

An MSB program operation is performed after the LSB program operation. The MSB program operation uses an incremental step pulse programming (ISPP) technique in which several loops of an iterative procedure are performed, each loop comprising a program pulse application step to incrementally increase the threshold voltage and a verify read step to determine whether the target threshold voltage has been reached.

In general, a two-bit memory cell may store the two bits using four threshold voltage distributions corresponding to logic states "E", P1, P2, and P3. For instance, in some embodiments, a memory cell MC1 is retained in logic state "E", memory cell MC2 is programmed to logic state P1, memory cell MC3 is programmed to logic state P2, and memory cell MC4 is programmed to logic state P3. Below, a program operation of a nonvolatile memory device according to an embodiment of the inventive concept will be more fully described with reference to the accompanying drawings.

FIG. 3A is a threshold voltage diagram illustrating possible states of memory cells after an LSB program operation is completed; FIG. 3B is a threshold voltage diagram illustrating possible states of memory cells while an MSB program operation is being performed; and FIG. 3C is a threshold voltage diagram illustrating possible states of memory cells after the MSB program operation is completed. In FIGS. 3A through 3C, a horizontal axis indicates threshold voltage Vth, and a vertical axis indicates a number of memory cells. The labels VR1, VR2, and VR3 each indicate a read voltage, and the labels Vf1, Vf2 and Vf3 each indicate a verification voltage.

Referring to FIG. 3A, memory cells may be retained at logic state "E" or programmed to a logic state P0. Logic state "E" is called an erase state. As illustrated in FIG. 3B, memory cells in erase state "E" may be retained in erase state "E" or programmed to logic state P1, and memory cells in logic state P0 may be programmed to logic state P2 or logic state P3.

In some embodiments, the time when the MSB program operation is completed is based on each memory cell and the logic state corresponding to each memory cell. For example, referring to FIG. 3B, memory cells to be programmed to logic state P1 are programmed first, and memory cells to be programmed to logic states P2 and P3 are programmed thereafter. For explanation purposes, it will be assumed that some of the memory cells to be programmed to logic state P2 or P3 are not successfully programmed in the first attempt. A program operation for memory cells that are not successfully programmed in the first attempt will be more fully described below.

Figure 4:
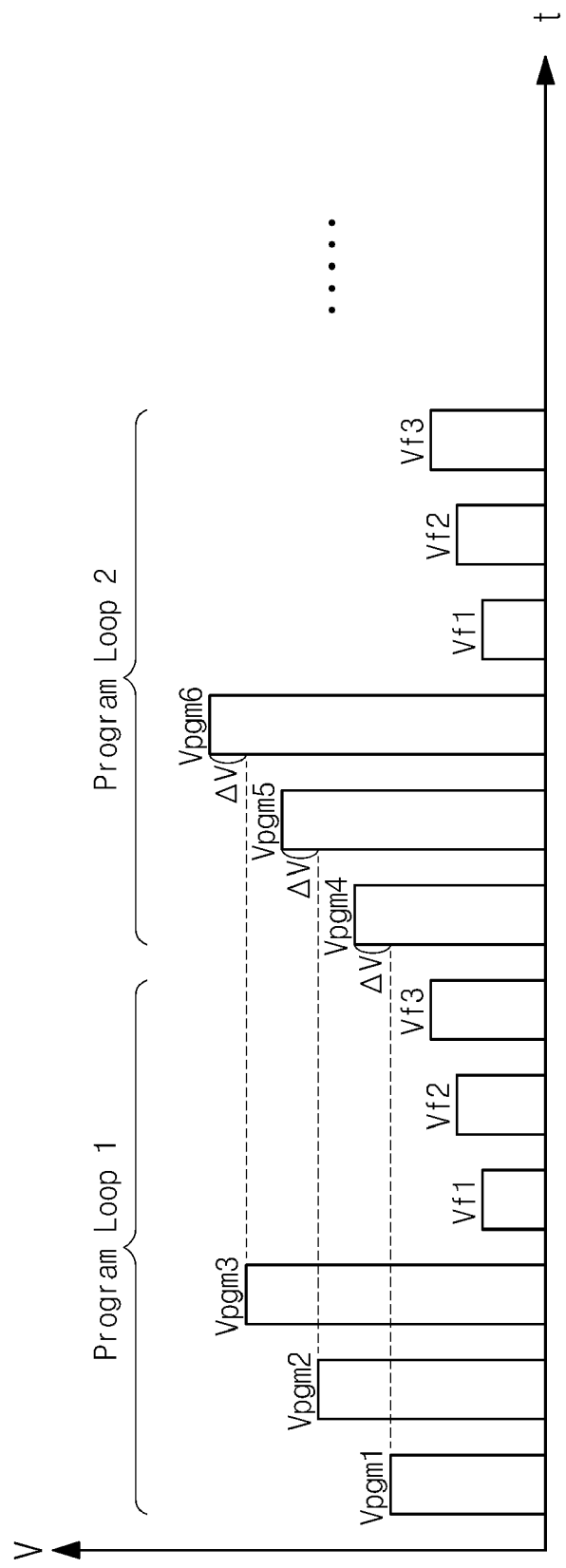
FIG. 4 is a voltage diagram illustrating program voltages and verification voltages in an MSB program operation according to an embodiment of the inventive concept.

FIG. 4 is a voltage diagram illustrating program voltages and verification voltages in an MSB program operation according to an embodiment of the inventive concept. In FIG. 4, a horizontal axis indicates time, and a vertical axis indicates voltage.

Figure 3:
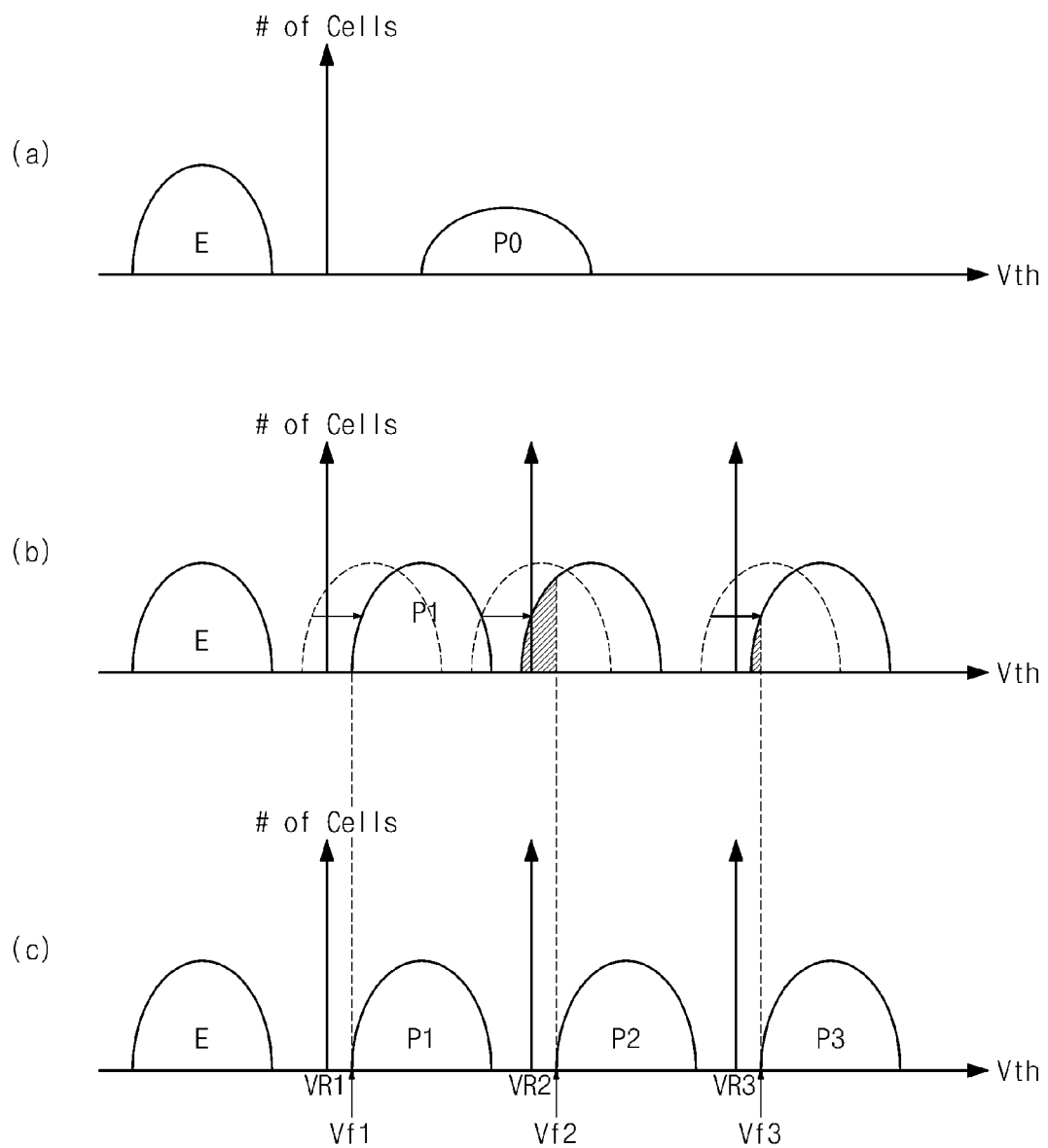
FIG. 3A is a threshold voltage diagram illustrating possible states of memory cells after an LSB program operation is completed.
FIG. 3B is a threshold voltage diagram illustrating possible states of memory cells while an MSB program operation is being performed.
FIG. 3C is a threshold voltage diagram illustrating possible states of memory cells after the MSB program operation is completed.

Referring to FIGS. 2 through 4, during an MSB program operation, three start program voltages Vpgm1 through Vpgm3 are applied sequentially to a selected wordline, such as wordline WL2. Then, three verification voltages Vf1 through Vf3 are supplied sequentially to selected wordline WL2. The three program voltages Vpgm1 through Vpgm3 and three verification voltages Vf1 through Vf3 are applied to selected wordline WL2 in the first program loop.

In the second program loop, program voltages Vpgm4 through Vpgm6, which are increased by an increment $\Delta V$ from program voltages Vpgm1 through Vpgm3, respectively, are applied to selected wordline WL2. As in the first program loop, three verification voltages Vf1 through Vf3 are supplied to selected wordline WL during the second program loop.

Thereafter, program loops are executed using program voltages that are increased by an increment $\Delta V$ from corresponding program voltages of a previous program loop. That is, a program operation may be performed using an ISPP technique. For ease of description, a program operation will be described with reference to memory cells MC1 through MC4 in FIG. 2. In FIG. 4, program voltages Vpgm1 and Vpgm4 correspond to logic state P1, program voltages Vpgm2 and Vpgm5 correspond to logic state P2, and program voltages Vpgm3 and Vpgm6 correspond to logic state P3.

In the first program loop, program voltage Vpgm1 is applied to selected wordline WL2. In some embodiments, program voltage Vpgm1 may be used to program memory cells to logic state P1. For instance, in one embodiment, program voltage Vpgm1 is applied to selected wordline WL2 and a selected bitline BL2 is connected to ground to program memory cell MC2 to logic state P1. During programming of memory cell MC2, bitlines BL1, BL3, and BL4 may be connected to a program-inhibition voltage Vcc so that memory cells MC1, MC3, and MC4 remain in erase state "E", i.e., they are program-inhibited.

After program voltage Vpgm1 is applied to selected wordline WL2, program voltage Vpgm2 is applied to selected wordline WL2. Program voltage Vpgm2 is used to program memory cells to logic state P2. In this example, bitline BL3 is connected to ground so that memory cell MC3 is programmed to logic state P2, while bitlines corresponding to memory cells MC1, MC2, and MC4 are connected to program-inhibition voltage Vcc. Where program voltage Vpgm2 is applied to selected wordline WL2, memory cell MC3 is programmed and memory cells MC1, MC2, and MC4 are program-inhibited.

Following program voltage Vpgm2, program voltage Vpgm3 is applied to selected wordline WL2. Program voltage Vpgm3 is used to program memory cells to logic state P3. For example, bitline BL4 is connected to ground so that memory cell MC4 is programmed to logic state P3, while bitlines connected to memory cells MC1 through MC3 are supplied with program-inhibition voltage Vcc. Where program voltage Vpgm3 is applied to selected wordline WL2, memory cell MC4 is programmed and memory cells MC1, MC2, and MC3 are program-inhibited.

After a program operation is executed according to program voltages Vpgm1, Vpgm2, and Vpgm3, a verification voltage Vf1 is applied to selected wordline WL2. Verification voltage Vf1 is used to determine whether memory cells are programmed to logic state P1. During the verification operation, bitlines BL1 through BL4 are pre-charged, and verification voltage Vf1 is applied to selected wordline WL2. As verification voltage Vf1 is applied to selected wordline WL2, it is determined whether memory cells corresponding to logic state P1 are programmed. The resulting states of the memory cells are stored in read/write circuit 120 of FIG. 1. In some embodiments, read/write circuit 120 comprises a page buffer.

Following the application of verification voltage Vf1, verification voltage Vf2 is applied to selected wordline WL2. Verification voltage Vf2 is used to determine whether memory cells are programmed to logic state P2. During the verification operation, bitlines BL1 through BL4 are pre-charged, and verification voltage Vf2 is applied to selected wordline WL2. Verification voltage Vf2 is applied to selected wordline WL2 to determine whether memory cells corresponding to logic state P2 are programmed. The resulting state of the memory cells is stored in read/write circuit 120. In some embodiments, read/write circuit 120 comprises a page buffer.

After verification voltage Vf2 is applied to selected wordline WL2, verification voltage Vf3 is applied to selected wordline WL2. Verification voltage Vf3 is used to determine whether memory cells are programmed to logic state P3. During the verification operation, bitlines BL1 through BL4 are pre-charged, and verification voltage Vf3 is applied to selected wordline WL2. Verification voltage Vf3 is applied to selected wordline WL2 to determine whether memory cells corresponding to logic state P3 are programmed. The resulting state of the memory cells is stored in read/write circuit 120. In some embodiments, read/write circuit 120 comprises a page buffer.

The second program loop may be executed following the first program loop. In MSB programming, the program loop is repeated until memory cells MC1 through MCm are all programmed to their target states (i.e., they are "program passed") or until a given number of program loops is executed.

For ease of description, it is assumed that after the first program loop, memory cell MC2 corresponding to logic state P1 is judged to be program passed and memory cells MC3 and MC4 corresponding respectively to logic states P2 and P3 are judged not to be programmed to their target states (i.e., they are "program failed"). Further, it is assumed that a current program loop number is less than a predetermined program loop number.

Under this assumption, because memory cell MC2 corresponding to logic state P1 is judged to be program passed, bitline BL2 corresponding to memory cell MC2 is supplied with program-inhibition voltage Vcc. On the other hand, because memory cells MC3 and MC4 corresponding to logic states P2 and P3 are judged to be program failed, bitlines BL3 and BL4 each corresponding to memory cells MC3 and MC4 are connected to ground. Afterward, the second program loop may be executed in the same manner as described above.

During the second program loop, although memory cell MC2 corresponding to logic state P1 is program passed, the program voltage corresponding to logic state P1 is applied to selected wordline WL2 until a current program loop number reaches the predetermined program loop number.

Figure 5:
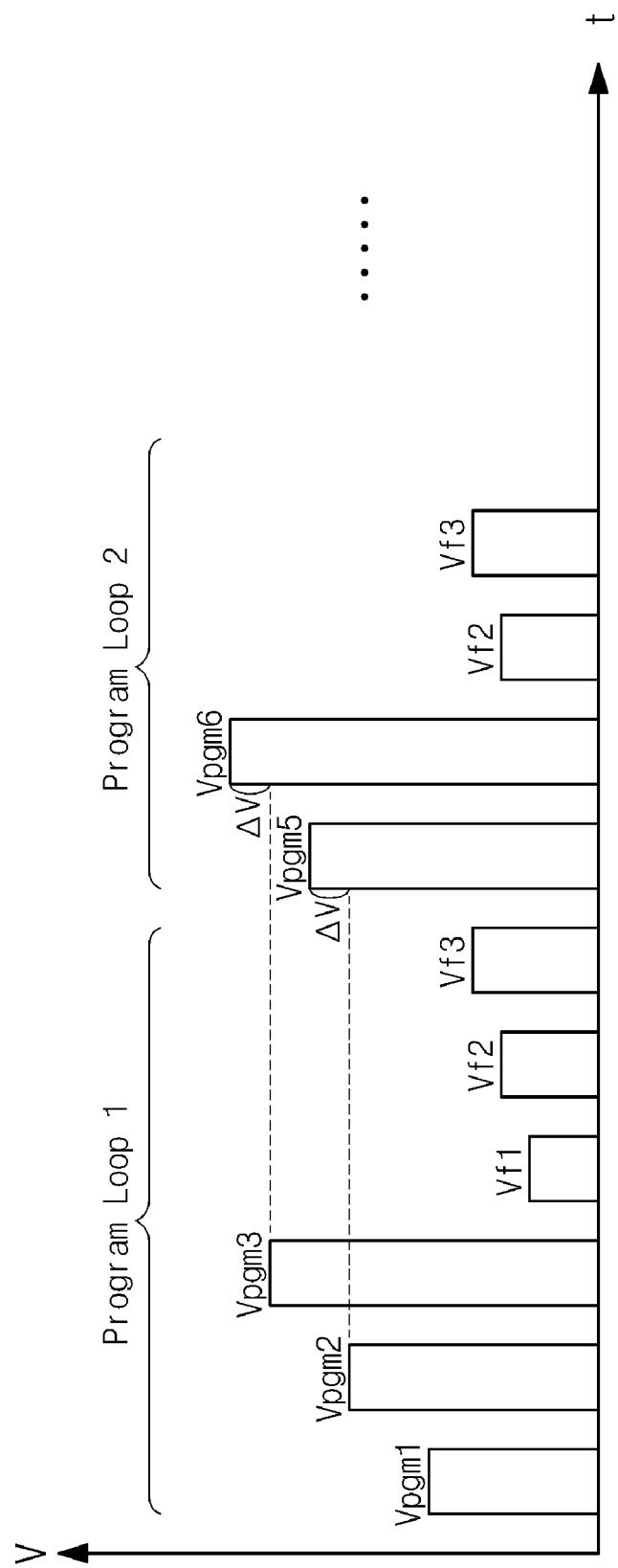
FIG. 5 is a voltage diagram illustrating program voltages and verification voltages in an MSB program operation according to another embodiment of the inventive concept.

FIG. 5 is a voltage diagram illustrating program voltages and verification voltages in an MSB program operation according to another embodiment of the inventive concept. In FIG. 5, the horizontal axis indicates time, and the vertical axis indicates voltage.

Referring to FIGS. 2 and 5, three start program voltages Vpgm1 through Vpgm3 are applied sequentially to selected wordline WL2 as a program voltage. Next, three verification voltages Vf1 through Vf3 are supplied sequentially to selected wordline WL2. Three program voltages Vpgm1 through Vpgm3 and three verification voltages Vf1 through Vf3 are applied to selected wordline WL2 for the first program loop.

The first program loop may be executed in the same manner as described in FIG. 4. Once again, for ease of description, a program operation is described with reference to memory cells MC1 through MC4 in FIG. 2. A program voltage Vpgm1 corresponds to logic state P1, program voltages Vpgm2 and Vpgm5 correspond to logic state P2, and program voltages Vpgm3 and Vpgm6 correspond to logic state P3.

For ease of description, it is assumed that during the first program loop, memory cell MC2 is judged to be program passed, but some memory cells to be programmed to logic state P2 (in this example, memory cell MC3) are judged to be program failed, and some memory cells to be programmed to logic state P3 (in this example, memory cell MC4) are judged to be program failed. Judgment results of logic states P1, P2, and P3 are stored in first through third registers 162a through 162c, respectively. Memory cells corresponding to logic state Pn ($1 \leq n \leq 4$) are programmed within an $M^{th}$ program loop ($M \geq 1$).

In this case, information indicating that memory cell MC2, which corresponds to logic state P1, is judged to be program passed is stored in first register 162a of storage region 162. Information indicating that memory cell MC3, which corresponds to logic state P2, is judged to be program failed is stored in second register 162b of storage region 162. Information indicating that memory cell MC4, which corresponds to logic state P3, is judged to be program failed is stored in third register 162c of storage region 162.

Program control part 161 of control logic component 160 controls voltage generator 150 based on information stored in storage region 162, indicating whether memory cells corresponding to a specific logic state are programmed. For example, in the above example where memory cell MC2 is program passed to state P1, program control part 161 may control voltage generator 150 so as not to generate program voltage Vpgm1 and verification voltage Vf1 corresponding to logic state P1, during repeated program loops. On the other hand, in the above example where memory cells MC3 is program failed, program control part 161 controls voltage generator 150 so as to generate program voltage Vpgm5 and verification voltage Vf2 corresponding to logic state P2. Herein, program voltage Vpgm5 is higher by an increment Δ V than program voltage Vpgm2. Likewise, program control part 161 controls voltage generator 150 so as to generate program voltage Vpgm6 and verification voltage Vf3 corresponding to logic state P3. Herein, program voltage Vpgm6 is higher by an increment Δ V than program voltage Vpgm3.

Voltage generator 150 generates program voltages Vpgm5 and Vpgm6 and verification voltages Vf2 and Vf3 in response to program control part 161. Program voltages Vpgm5 and Vpgm6 and verification voltages Vf2 and Vf3 are applied through address decoder 140 to selected wordline WL2 during the second program loop.

In the second program loop, program and verification voltages Vpgm4 and Vf1 corresponding to logic state P1 are not supplied to selected wordline WL2. This eliminates any program disturbances and coupling effects caused by program or verification voltage Vpgm4 or Vf1 in FIG. 3, which in turn improves the efficiency of program operations. Further, because the second program loop does not comprise periods in which program and verification voltages Vpgm4 and Vf1 are applied, it is possible to reduce a total program time.

The above-described program method is not limited to MSB program operations. For example, the above-described program method may be applied to a program scheme in which memory cells are programmed from logic state "E" to logic states P1, P2, and P3.

In one embodiment, nonvolatile memory device 100 is configured such that the information in first to third registers 162a through 162c is provided to an external device. The external device manages nonvolatile memory device 100, based on information in first through third registers 162a through 162c.

Figure 6:
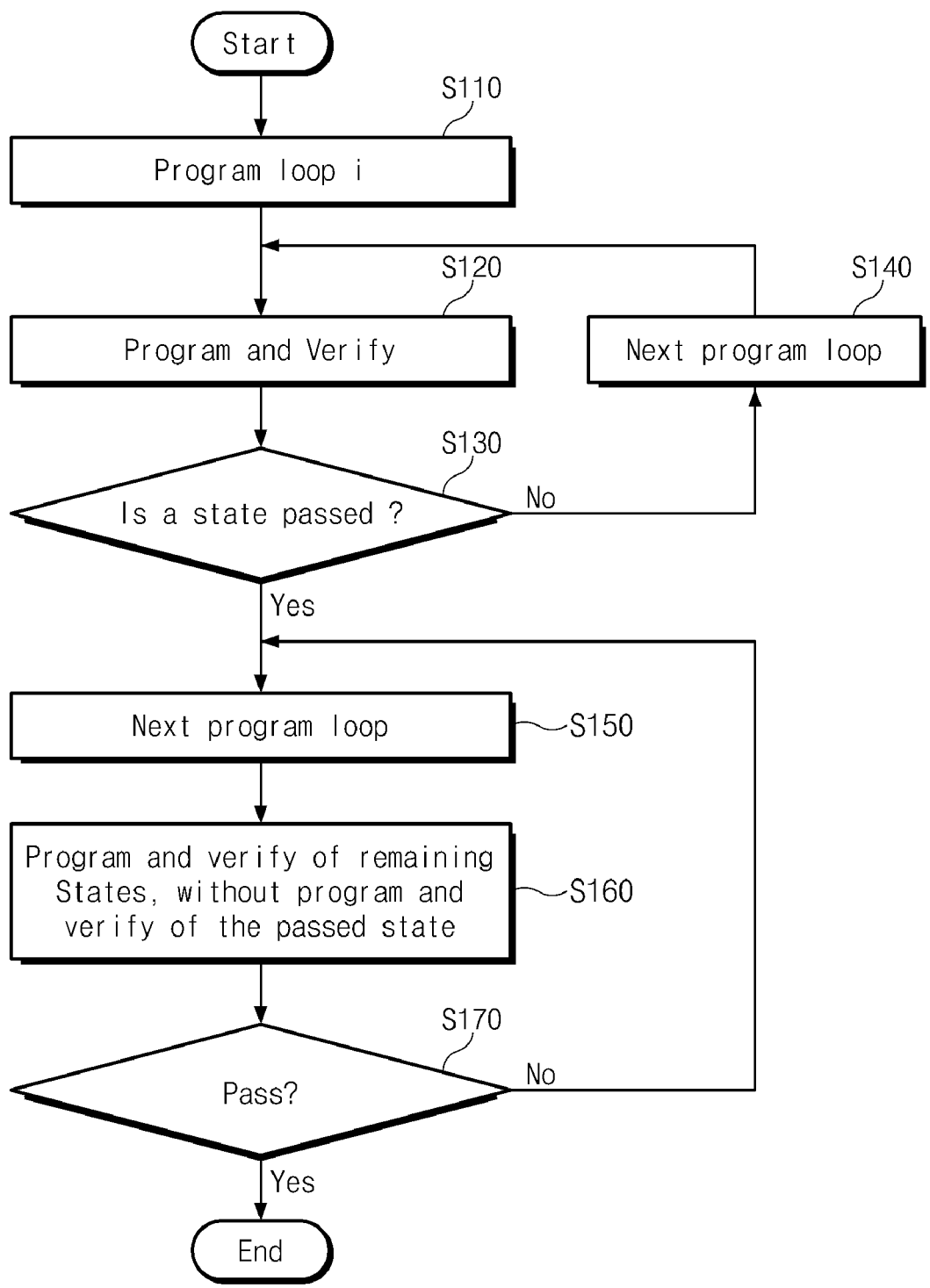
FIG. 6 is a flowchart illustrating a method of performing a program method in accordance with the voltage diagram of FIG. 5.

FIG. 6 is a flowchart illustrating a method of performing a program operation in accordance with the voltage diagram of FIG. 5.

Referring to FIG. 6, a first program loop begins in a step S110. Program control part 161 controls voltage generator 150 to generate voltages for the first program loop. In step S110, voltage generator 150 generates three program voltages Vpgm1, Vpgm2, and Vpgm3 and three verification voltages Vf1, Vf2, and Vf3. Registers 162a, 162b, and 162c, which correspond to respective logic states P1, P2, and P3, store information indicating program failures for logic states P1, P2, and P3.

In step S120, a program operation and a verification operation are executed under the control of control logic component 160, in particular, program control part 161. For example, program voltages Vpgm1, Vpgm2, and Vpgm3 may be applied sequentially through a selected wordline WL2 to selected memory cells. Accordingly, the memory cells connected to selected wordline WL2 are programmed to have corresponding logic states P1, P2, and P3. The program operation executed in step S120 may be identical to that described in FIGS. 4 and 5, and therefore a further description of the program operation is omitted to avoid redundancy.

Thereafter, verification voltages Vf1, Vf2, and Vf3 generated by voltage generator 150 are applied sequentially to selected wordline WL2. For example, verification voltages Vf1, Vf2, and Vf3 are applied to the memory cells via selected wordline WL2. Under this bias conditions, it may be determined whether memory cells are programmed to corresponding logic states P1, P2, and P3. The verification operation executed in step S120 may be identical to that described in FIGS. 4 and 5, and therefore additional description thereof is omitted. Verification/judgment results corresponding to logic states P1, P2, and P3 are stored in registers 162a, 162b, and 162c, respectively.

In some embodiments, the determination of whether memory cells corresponding to a logic state are program passed is made according to data bits read from the memory cells. This determination is made by control logic component 160. In this case, read/write circuit 120 outputs program pass data with respect to memory cells that are not associated with a verification voltage applied to a selected wordline.

In subsequent step S130, control logic component 160 determines whether programming for a logic state (for example P1) is passed, based on information stored in first register 162a (corresponding to logic state P1). If the programming for a logic state (for example P1) is judged to be failed (S130=No), the procedure advances to step S140, in which a next program loop, that is, the second program loop commences. For example, in step S130, program control part 161 controls voltage generator 150 to generate program voltages Vpgm4, Vpgm5, and Vpgm6, which are incremented by $\Delta V$ relative to program voltages Vpgm1, Vpgm2, and Vpgm3, respectively. In this case, voltage generator 150 generates verification voltages Vf1, Vf2, and Vf3, which are identical in magnitude to those generated within the previous program loop.

If the programming for a logic state (for example P1) is judged to be passed (S130=Yes), the procedure advances to step S150, where the next program loop begins. For example, in step S150, program control part 161 controls voltage generator 150 to generate program voltages (for example, Vpgm5 and Vpgm6) higher by an increment V than program voltages (for example, Vpgm2 and Vpgm3, respectively) generated within a previous program loop. In this case, voltage generator 150 generates verification voltages Vf2 and Vf3, which are identical in level to those generated within the previous program loop.

In subsequent step S160, a program operation and a verification operation are executed under the control of control logic component 160. For example, program voltages Vpgm5 and Vpgm6 are applied sequentially to selected memory cells via selected wordline WL2. The program operation executed in step S160 may be identical to that described in FIGS. 4 and 5, and therefore additional description thereof is omitted to avoid redundancy.

Thereafter, verification voltages Vf2 and Vf3 are applied sequentially to selected wordline WL2. In this example, verification voltages Vf2 and Vf3 are applied to selected memory cells via selected wordline WL2. Under this bias condition, it is determined whether memory cells are programmed to have corresponding logic states P2 and P3. The verification operation executed in step S160 may be identical to that described in FIGS. 4 and 5, and description thereof is omitted. Verification results corresponding to logic states P2 and P3 are stored in second and third registers 162b and 162c, respectively.

As understood from the above description, program and verification operations of a passed logic state (i.e., a logic state for which all corresponding memory cells have been successfully programmed) may be skipped under the control of program control part 161.

In step S170, control logic component 160 determines whether programming for remaining logic states (for example, P2 and P3) is passed, based on information stored in second and third registers 162b and 162c (corresponding to logic states P2 and P3). Once programming for remaining logic states (for example, P2 and P3) is judged to be passed (S170=Yes), the program operation is completed. On the other hand, where programming for one or more logic states (for example, P2 and P3) is judged to be failed (S170=No), the procedure advances to step S150.

In another embodiment, where memory cells corresponding to logic state P2 and P3 are judged to be program passed, program and verification operations of passed logic state P2 or P3 may be skipped, during repeated program loops. In still another embodiment, it is possible to skip verification operations corresponding to logic states P2 and P3 until memory cells corresponding to logic state P1 are judged to be program passed. Alternatively, it is possible to skip program and verification operations according to a pass order of logic states P1, P2, and P3.

Figure 7:
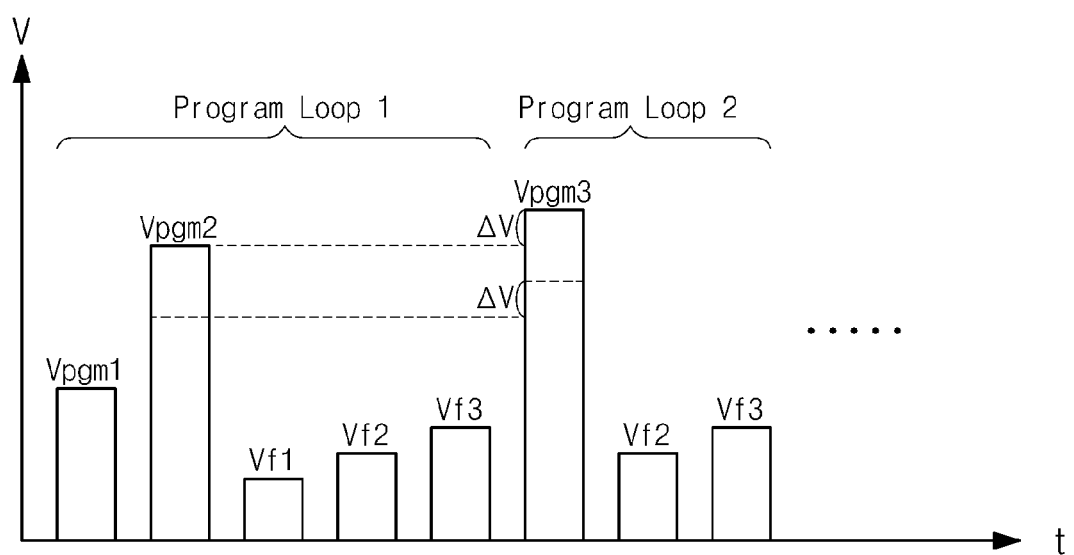
FIG. 7 is a voltage diagram illustrating program voltages and verification voltages in an MSB program operation according to still another embodiment of the inventive concept.

FIG. 7 is a voltage diagram illustrating program voltages and verification voltages in an MSB program operation according to still another embodiment of the inventive concept. In FIG. 7, a horizontal axis indicates time, and a vertical axis indicates voltage.

Referring to FIG. 7, during the first program loop, two program voltages Vpgm1 and Vpgm2 and three verification voltages Vf1, Vf2, and Vf3 are applied to a selected wordline (for example, wordline WL2) according to a predetermined order.

For explanation purposes, it will be assumed that program voltage Vpgm1 is used to program memory cells to logic state P1 as described in FIG. 5., and program voltage Vpgm2 is used to program memory cells to logic state P2 and logic state P3.

While program voltage Vpgm2 is supplied to selected wordline WL2, bitline BL3 corresponding to logic state P2 is biased by a voltage (e.g., 1V) which is lower than a program-inhibition voltage (e.g., Vcc) and higher than a ground voltage. Further, bitline BL4 corresponding to logic state P3 is biased to ground. At this time, bitlines (e.g., BL1 and BL2) corresponding to logic state "E" and logic state P1, respectively, are biased with the program-inhibition voltage.

In this embodiment, voltage generator 150 in FIG. 1 is configured to generate a bitline voltage (e.g., 1V) which is lower than a program-inhibition voltage (for example, Vcc) and higher than ground. That is, as illustrated by a dotted line in FIG. 1, voltage generator 150 comprises bitline voltage generator VBL configured to generate the bitline voltage.

With this bias condition, where program voltage Vpgm2 is supplied to selected wordline WL2, a memory cell is programmed to correspond to logic state P2 and another memory cell is programmed to correspond to logic state P3. On the other hand, where program voltage Vpgm2 is supplied to a selected wordline WL2, memory cells corresponding to logic states "E" and P1 are program inhibited.

In some embodiments, verification voltage Vf1 is used to judge whether memory cells to be programmed to logic state P1 are program passed. Similarly, verification voltage Vf2 is used to judge whether memory cells to be programmed to logic state P2 are program passed, and verification voltage Vf3 is used to judge whether memory cells to be programmed to logic state P3 are program passed.

In one example, it is assumed that memory cell MC2 to be programmed to logic state P1 is program passed, memory cell MC3 to be programmed to logic state P2 is program failed, and memory cell MC4 to be programmed to logic state P3 is program failed. These "failed" or "passed" results are detected and then stored in the corresponding portions of storage region 162. In particular, the results associated with logic states P1, P2, and P3 are stored in first through third registers 162a, 162b, and 162c, respectively.

Under these assumptions, program control part 161 controls voltage generator 150 so as not to generate program and verification voltages Vpgm1 and Vf1 corresponding to logic state P1, that is, passed logic state P1, based on the information stored in first through third registers 162a, 162b, and 162c.

During the second program loop, program voltage Vpgm3 is applied to selected wordline WL2. In this example, program voltage Vpgm3 is used to program memory cells to logic states P2 and P3. At this time, bitline BL3 corresponding to logic state P2 is biased by a voltage (for example, 1V) which is lower than a program-inhibition voltage (for example, Vcc) and higher than a ground voltage. Bitline BL4 corresponding to logic state P3 is biased by a ground voltage. On the other hand, bitlines BL1 and BL2 corresponding to logic state "E" or P1 are biased by the program-inhibition voltage. Thereafter, program voltage Vpgm3 is applied to selected wordline WL2.

Following program voltage Vpgm2, verification voltages Vf2 and Vf3 are applied to selected wordline WL2. Verification voltages Vf2 and Vf3 are used to judge the program states of memory cells MC1 through MC4 in the manner described in FIG. 5. Thus, further description is omitted to avoid redundancy.

The program scheme in FIG. 7 is similar to the program scheme in FIG. 5 except that the memory cells of logic states P2 and P3 are programmed by one program voltage. This reduces the number of program voltages applied to a selected wordline within one program loop and further reduces program disturbances, coupling, and total program time. This process improves the overall efficiency of program operations.

Figure 8:
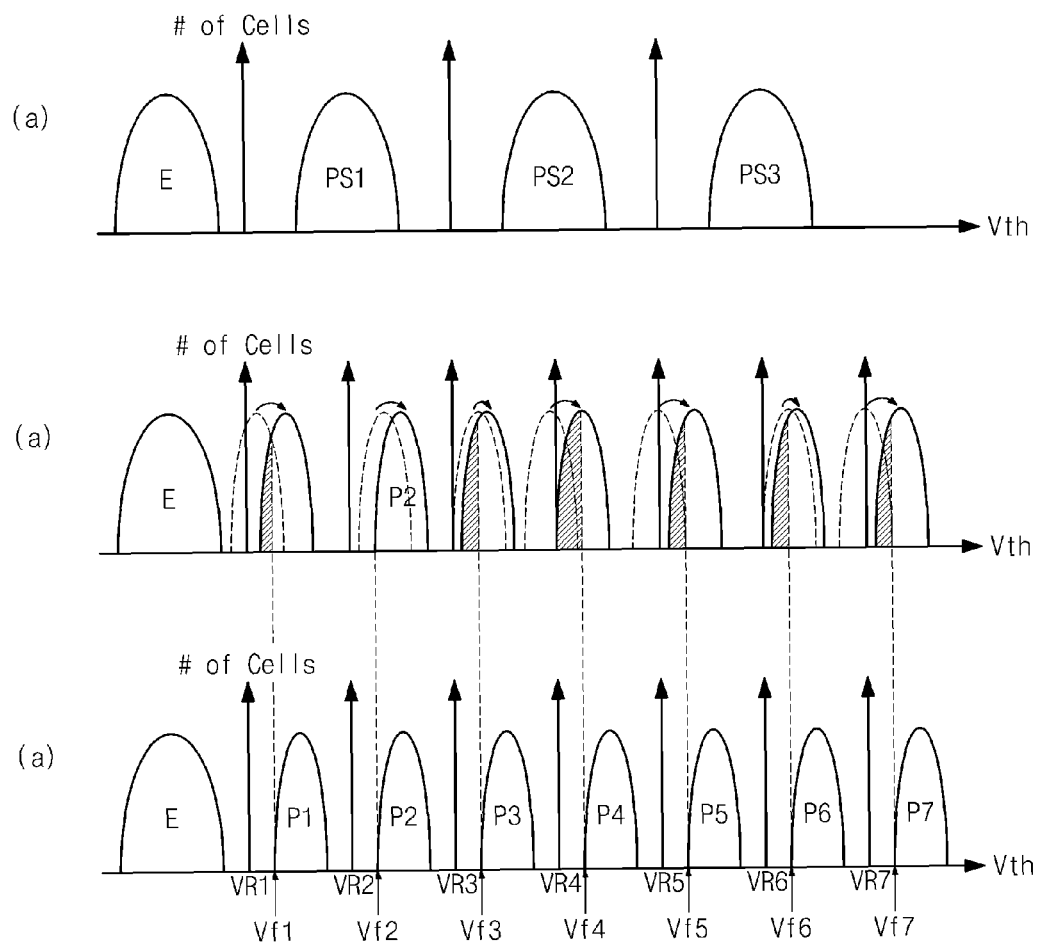
FIG. 8A is a threshold voltage diagram illustrating possible states of memory cells after a 2-bit program operation is completed.
FIG. 8B is a threshold voltage diagram illustrating possible states of memory cells while a 3-bit program operation is being performed.
FIG. 8C is a threshold voltage diagram illustrating possible states of memory cells after the 3-bit program operation is completed.

FIG. 8A is a threshold voltage diagram illustrating possible states of memory cells after a 2-bit program operation is completed; FIG. 8B is a threshold voltage diagram illustrating possible states of memory cells while a 3-bit program operation is being performed; and FIG. 8C is a threshold voltage diagram illustrating possible states of memory cells after a 3-bit program operation is completed. In FIGS. 8A through 8C, the labels Vf1, Vf2, and Vf3 indicate verification voltages, and the labels VR1 through VR7 indicate read voltages.

Referring to FIGS. 8A and 8B, the time required to program memory cells with 3-bit data differs according to the memory cells and their logic states.

In this example, it is assumed that memory cells corresponding to logic state P2 are program passed after a first program loop and memory cells corresponding to logic states P1 and P3 through P7 are not program failed after the first program loop. The execution of the first and second program loops will be describe in further detail with reference to FIG. 9.

Figure 9:
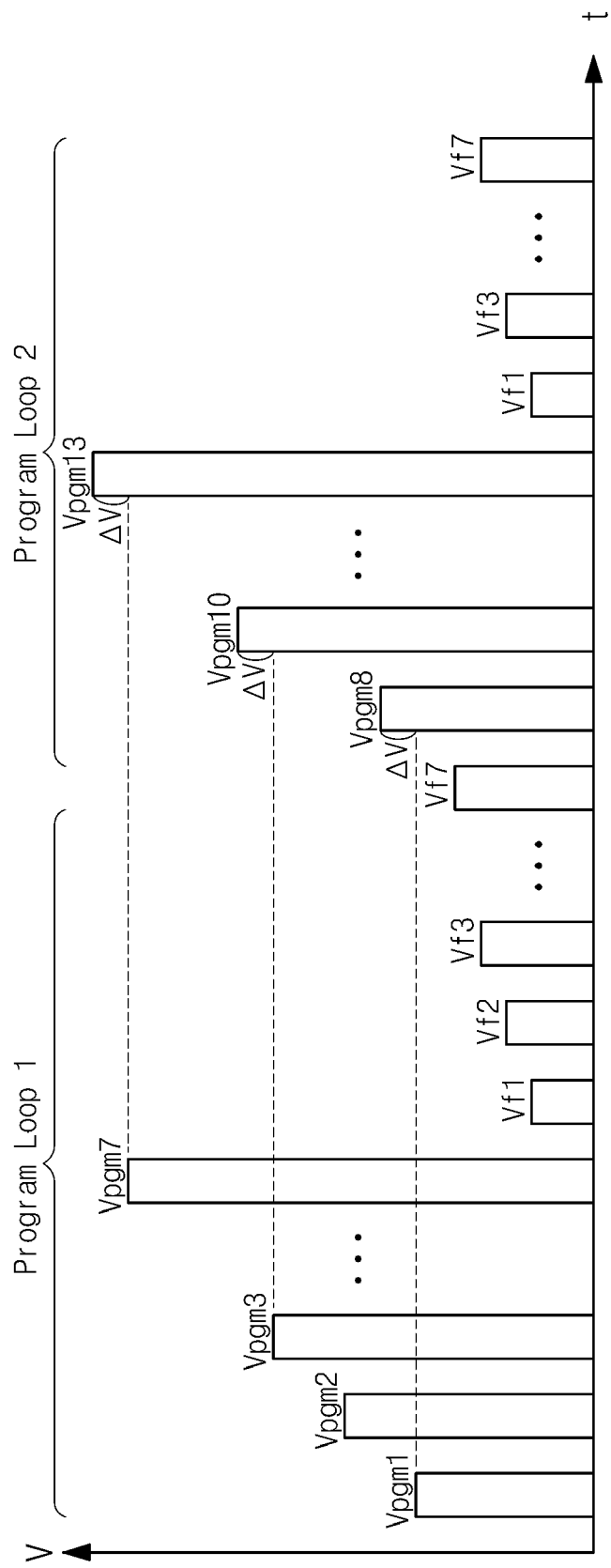
FIG. 9 is a voltage diagram illustrating program voltages and verification voltages in a 3-bit program operation according to still another embodiment of the inventive concept.

FIG. 9 is a voltage diagram illustrating program voltages and verification voltages in a 3-bit program operation according to still another embodiment of the inventive concept. In FIG. 9, the horizontal axis indicates time, and the vertical axis indicates voltage.

In FIG. 9, program voltages Vpgm1 through Vpgm7 and verification voltages Vf1 through Vf7 are applied to a selected wordline in a given order. Program voltages Vpgm1 through Vpgm7 and verification voltages Vf1 through Vf7 correspond to logic states P1 through P7, respectively. For example, program voltage Vpgm1 and verification voltage Vf1 correspond to logic state P1, while program voltage Vpgm2 and verification voltage Vf2 correspond to logic state P2, and program voltage Vpgm3 and verification voltage Vf3 correspond to logic state P3.

During the first program loop, program voltages Vpgm1 through Vpgm7 and verification voltages Vf1 through Vf7 are applied to a selected wordline in a manner similar to that described in relation to FIGS. 4 and 5. During the first program loop, memory cells corresponding to logic state P2 are successfully programmed, i.e., they are program passed.

Where memory cells corresponding to logic state P2 have been programmed correctly, program control part 161 controls voltage generator 150 so that program and verification voltages corresponding to logic state P2 are not generated during the second program loop. This is accomplished by storing judgment results in registers of storage region 162 corresponding to logic states P1 through P7, with the judgment results indicating whether all memory cells to corresponding to each designated logic state has been successfully programmed.

During the second program loop, program and verification operations are made using program and verification voltages Vpgm1, Vpgm3 through Vpgm7, and Vf1, Vf3 through Vf7, with program and verification voltages Vpgm2 and Vf2 not applied to the selected wordline. In other words, once memory cells have been successfully programmed to logic state P2, those memory cells are not further programmed during subsequent program loops.

Reducing the number of program and verification operations in this manner tends to reduce program disturbances and coupling effects. In addition, it may also reduce total program time and improve program efficiency.

Figure 10:
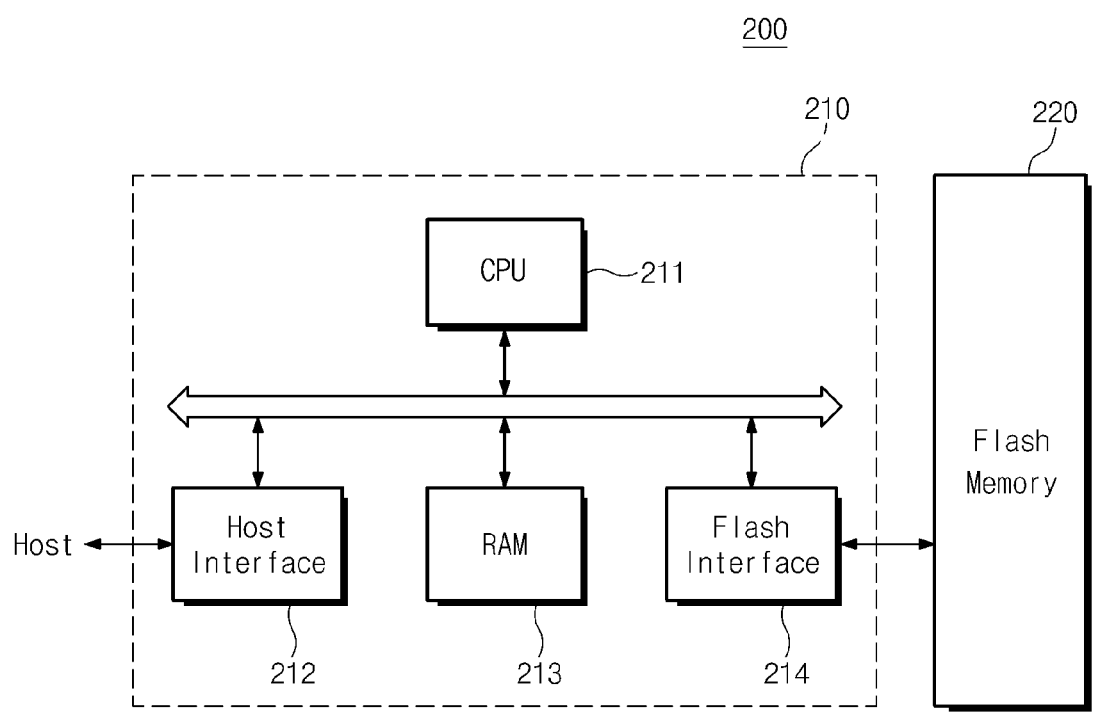
FIG. 10 is a block diagram illustrating a semiconductor memory device comprising a flash memory in accordance with an embodiment of the inventive concept.

FIG. 10 is a block diagram illustrating a semiconductor memory 200 device comprising a flash memory in accordance with an embodiment of the inventive concept.

Semiconductor memory device 200 comprises a memory controller 210 and a flash memory 220. Semiconductor memory device 200 may further comprise other storage devices, such as volatile or nonvolatile memories or a nonvolatile memory device, and may comprise a memory card, such as a secure digital (SD) card or a multimedia card (MMC), or a removable and portable storage device, such as a USB memory. As illustrated in FIG. 10, memory controller 210 comprises a CPU 211, a host interface 212, a RAM 213, and a flash interface 214.

Figure 11:
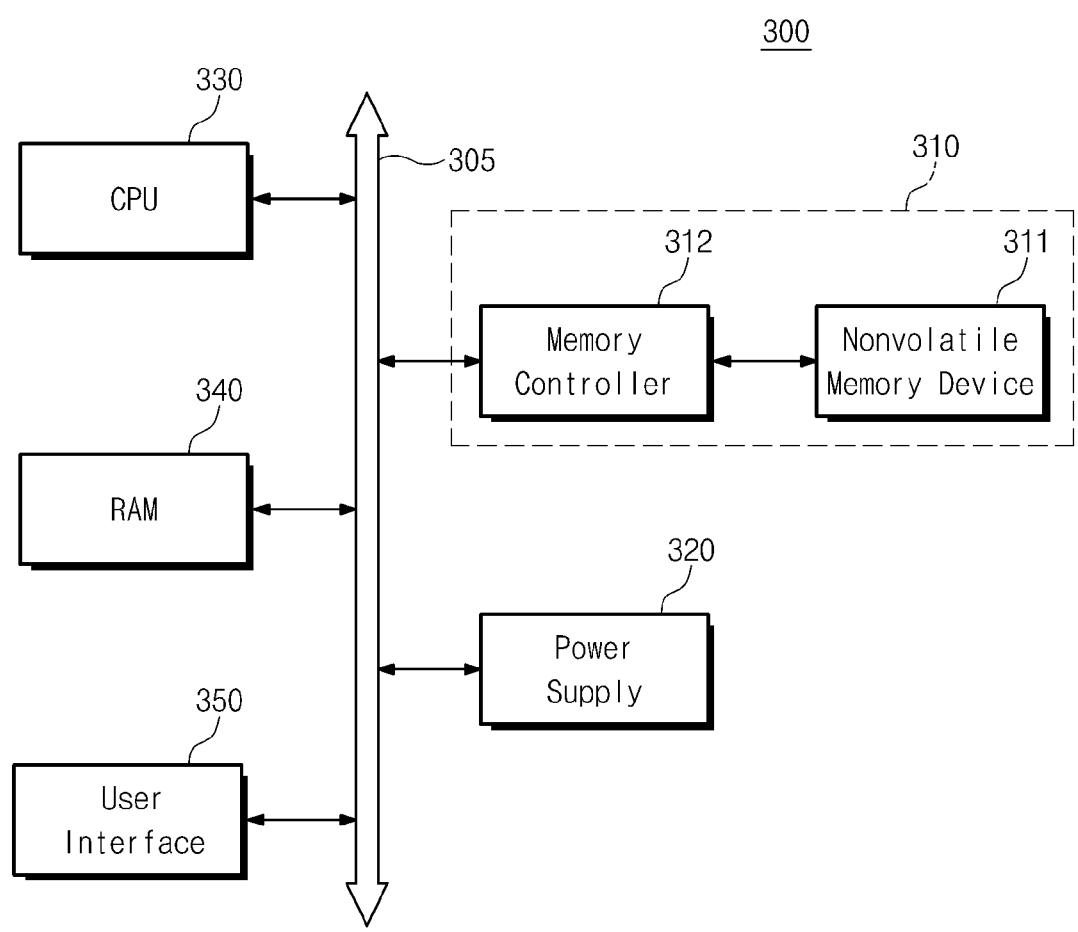
FIG. 11 is a block diagram illustrating a user device in accordance with an embodiment of the inventive concept.

FIG. 11 is a block diagram illustrating a user device 300 in accordance with an embodiment of the inventive concept. User device 300 may be a personal computer or portable electronic device, such as a notebook computer, cellular phone, personal digital assistant (PDA), camera, and the like.

Referring to FIG. 11, user device 300 comprises a bus and power line 305, a memory system 310, a power supply 320, a CPU 330, a RAM 340, and a user interface 350. Memory system 310 comprises a nonvolatile memory device 311 and a controller 312.

Controller 312 is connected to nonvolatile memory device 311 and is configured to read data from and store data in nonvolatile memory device 311.

Controller 312 typically comprises elements such as a RAM, a processing unit, a host interface, and a memory interface. The RAM is used as a working memory of the processing unit. The processing unit controls the overall operation of controller 312. The host interface comprises a protocol for exchanging data between a host and controller 312. The memory interface typically implements a protocol for interacting with nonvolatile memory device 311. Controller 312 further comprises an ECC block which is configured to detect and correct errors of data read from nonvolatile memory device 311.

Nonvolatile memory device 311 comprises a memory cell array for storing data, a read/write circuit for writing and reading data in and from the memory cell array, an address decoder configured to decode an externally provided address and transfer the decoded address to the read/write circuit, and a control logic component configured to control the overall operation of nonvolatile memory device 311.

In some embodiments, controller 312 communicates with an external device, such as a host, via one of various interface protocols such as a universal serial bus (USB), multimedia card (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE).

Controller 312 and nonvolatile memory device 311 are integrated to form one semiconductor device. In one embodiment, controller 312 and nonvolatile memory device 311 are integrated to form a memory card. For example, controller 312, nonvolatile memory 311, and a cache memory (not shown) may be integrated to form a PCMCIA card, a compact flash (CF) card, a SmartMedia Card (SM/SMC), a memory stick, a multimedia card (MMC), a reduced-size multimedia card (RS-MMC), an MMCmicro card, a secure digital (SD) card, a miniSD card, a microSD card, or a universal flash storage (UFS) card, to name but a few.

Alternatively, controller 312 and nonvolatile memory device 311 may be integrated to form a solid state drive/disk (SSD). Using memory system 310 as an SSD can greatly improve the operating speed of a device connected with user device 300.

In other embodiments, memory system 310 is implemented in a computer, portable computer, ultra-mobile PC (UMPC), workstation, net-book, personal digital assistant (PDA), web tablet, wireless phone, mobile phone, smart phone, digital camera, digital audio recorder/player, digital picture/video recorder/player, a device capable of transmitting and receiving information via wireless communication, one of various electronic devices constituting a home network, one of various electronic devices constituting a computer network, one of various electronic devices constituting a telematics network, or one of various electronic devices constituting a computing system, such as a solid state drive/disk SSD or memory card.

In another embodiment, nonvolatile memory device 311 or memory system 310 may be packed by various packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi-chip package (MCP), wafer-level fabricated package (WFP), or a wafer-level processed stack package (WSP).

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A nonvolatile memory device comprising:
   a memory cell array comprising a plurality of memory cells;
   a voltage generator configured to generate voltages to program the plurality of memory cells to a plurality of logic states; and
   a control logic component configured to control the voltage generator to provide a plurality of program voltages to selected memory cells during multiple program loop iterations,
   wherein where all of the selected memory cells corresponding to one of the plurality of logic states are judged to be program passed during a current program loop iteration, the control logic component controls the voltage generator such that a program voltage corresponding to the one of the plurality of logic states is skipped during a next program loop iteration.

2. The nonvolatile memory device of claim 1, wherein the plurality of program voltages correspond to different respective logic states.

3. The nonvolatile memory device of claim 2, wherein the control logic component is further configured to control the voltage generator to generate a plurality of verification voltages within each program loop iteration.

4. The nonvolatile memory device of claim 3, wherein the control logic component is configured to control the voltage generator to generate one of the plurality of verification voltages following each of the plurality of program voltages.

5. The nonvolatile memory device of claim 2, wherein each of the plurality of program voltages corresponds to one or more logic states.

6. The nonvolatile memory device of claim 1, further comprising a storage region configured to store information indicating whether memory cells corresponding to the logic state are judged to be program passed.

7. The nonvolatile memory device of claim 1, wherein each of the plurality of memory cells stores two or more bits of data.

8. The nonvolatile memory device of claim 1, wherein the plurality of program voltages increase monotonically within each program loop iteration.

9. A method of programming multi-bit data in a nonvolatile memory device, comprising:
performing multiple program loop iterations in which a plurality of program voltages and a plurality of verification voltages are applied to a selected wordline to program selected memory cells into target states,
wherein where all of the selected memory cells to be programmed at least one of the target states are successfully programmed in a current program loop iteration, generation of the program and verification voltages corresponding to the at least one target state is skipped in subsequent program loop iterations.

10. The method of claim 9, wherein the plurality of program voltages and the plurality of verification voltages are applied sequentially to the selected wordline.

11. The method of claim 9, wherein each of the plurality of program voltages are used to program memory cells into one of the target states.

12. The method of claim 9, wherein at least one of the plurality of program voltages is used to program memory cells into at least two of the target states.

13. The method of claim 12, wherein when the at least one program voltage is applied to the selected wordline, a bitline corresponding to one of the at least two target states is biased with a voltage lower than a program-inhibition voltage and higher than a ground voltage, and a bitline corresponding to the other of the at least two target states is biased to ground.

14. The method of claim 9, further comprising:
storing information, indicating that the at least one target state is program passed, in a register of the nonvolatile memory device.

15. The method of claim 14, wherein the information in the register is provided to the external of the nonvolatile memory device.

16. The method of claim 14, wherein the information in the register is used to control a generation of the plurality of program voltages and the plurality of verification voltages in the subsequent program loop iterations.

17. A method of programming multi-bit data in a nonvolatile memory device, comprising:
(a) supplying selected memory cells with a plurality of program voltages to program the selected memory cells into target states;
(b) supplying the selected memory cells with a plurality of program voltages to verify whether the selected memory cells are programmed into the target states;
(c) judging whether the each of the selected memory cells is successfully programmed to a corresponding one of the target states;
(d) storing results of the judging in a register; and
(e) iterating a program loop comprising (a)-(d) until all of the selected memory cells are successfully programmed to the corresponding target states,
wherein where all of the selected memory cells corresponding one of the target states are successfully programmed in one iteration of the program loop, generation of program and verification voltages corresponding to the one target state is skipped during subsequent iterations of the program loop.

18. The method of claim 17, wherein at least one of the plurality of program voltages is used to program memory cells into at least two of the target states.

19. The method of claim 18, wherein where the at least one program voltage is applied to the selected memory cells, a bitline corresponding to one of the at least two target states is biased with a voltage lower than a program-inhibition voltage and higher than a ground voltage, and a bitline corresponding to the other of the at least two target states is biased with a ground voltage.

20. The method of claim 17, further comprising:
increasing each of the plurality of program voltages during each successive iteration of the program loop.

* * * * *